United States Patent
Miyake et al.

(10) Patent No.: US 7,671,370 B2
(45) Date of Patent: Mar. 2, 2010

(54) DISPLAY DEVICE AND FABRICATION METHOD THEREOF

(75) Inventors: Hidekazu Miyake, Mobara (JP); Toshihiko Itoga, Chiba (JP); Eiji Oue, Mobara (JP); Takeshi Noda, Mobara (JP)

(73) Assignee: Hitachi Displays, Ltd., Chiba (JP)

( * ) Notice: Subject to any disclaimer, the term of this patent is extended or adjusted under 35 U.S.C. 154(b) by 97 days.

(21) Appl. No.: 11/898,997

(22) Filed: Sep. 18, 2007

(65) Prior Publication Data
US 2008/0073654 A1    Mar. 27, 2008

(30) Foreign Application Priority Data
Sep. 27, 2006  (JP) ............... 2006-262884

(51) Int. Cl.
*H01L 27/14* (2006.01)
(52) U.S. Cl. ............... 257/72; 257/57; 257/59; 257/64; 257/66; 257/79; 438/149; 438/155; 438/486; 438/490
(58) Field of Classification Search ............... 257/49, 257/75
See application file for complete search history.

(56) References Cited

U.S. PATENT DOCUMENTS

| | | | |
|---|---|---|---|
| 6,756,614 B2 | 6/2004 | Hatano et al. | |
| 6,943,086 B2 | 9/2005 | Hongo et al. | |
| 2003/0142043 A1* | 7/2003 | Matsueda | ............... 345/30 |
| 2004/0135150 A1* | 7/2004 | Sato et al. | ............... 257/72 |

FOREIGN PATENT DOCUMENTS

JP    08-116067    5/1995

\* cited by examiner

*Primary Examiner*—N Drew Richards
*Assistant Examiner*—Kyoung Lee
(74) *Attorney, Agent, or Firm*—Stites & Harbison PLLC; Juan Carlos A. Marquez, Esq.

(57) ABSTRACT

Improvement in characteristics of a SELAX-TFT and throughput of ELA crystallization is achieved. When a thin film transistor using pseudo single crystal semiconductor and a thin film transistor using particulate polysilicon semiconductor are formed on a single substrate, the film thickness of an amorphous semiconductor film before crystallization in the pseudo single crystal semiconductor portion is greater than that in the polysilicon semiconductor portion.

5 Claims, 14 Drawing Sheets

N-MOS             P-MOS

P-MOS    N-MOS

FIG. 18

DISPLAY DEVICE AND FABRICATION METHOD THEREOF

The present application claims priority from Japanese applications JP2006-2262884 filed on Sep. 27, 2006, the content of which is hereby incorporated by reference into this application.

BACKGROUND OF THE INVENTION

The present invention relates to a method for fabricating a thin film transistor, a display device having a circuit using a thin film transistor fabricated by the fabrication method, and a method for fabricating the display device.

As a display panel of a flat panel display device (FPD), a system-in-panel is in practical use in which not only a pixel section but a peripheral circuit including a drive circuit are built on a substrate that forms the display panel. To achieve such a system-in-panel, it is desirable to use a polycrystalline silicon (Si) layer (referred to as a polysilicon layer, a p-Si layer, an ELA silicon layer or the like) for a low-performance thin film transistor (TFT) circuit section, such as a pixel circuit section, which does not need relatively fast operation, while stripe-shaped silicon crystal (also referred to as pseudo single crystal, a laterally grown silicon crystal layer, a SELAX (Selectively Enlarging Laser X'tallization) silicon layer or the like) for a high-performance TFT circuit section, such as a signal line drive circuit, which needs relatively fast operation.

An ELA silicon layer is a particulate polycrystalline silicon layer obtained by applying an excimer laser beam to an amorphous silicon layer (a-Si layer) followed by annealing. This particulate polycrystalline silicon layer is hereinafter also referred to as the ELA silicon layer (ELA-Si) described above. A SELAX silicon layer is obtained by scanning and applying a continuous-wave laser beam to an amorphous silicon layer or an ELA silicon layer to modify it into a silicon layer made of stripe-shaped crystal (pseudo single crystal) grown along the scan direction (lateral direction). This modified silicon layer is hereinafter also referred to as the SELAX silicon layer (SELAX-Si) described above.

JP-A-2002-222959 and JP-A-2003-124136 disclose related art relevant to formation of stripe-shaped silicon crystal. JP-A-08-116067 focuses attention on the film thickness of silicon that forms an active layer from the viewpoint of OFF current in a thin film transistor.

SUMMARY OF THE INVENTION

The characteristics of a thin film transistor using a SELAX silicon layer (SELAX-TFT) can be improved by increasing the film thickness of silicon and hence increasing the width of the crystal grains. The energy necessary for the crystallization increases only by a small amount even when the film thickness of silicon that forms the active layer increases.

In contrast, to obtain characteristics necessary for a thin film transistor using an ELA silicon layer (ELA-TFT), it is necessary to increase the energy for the crystallization as the film thickness of silicon increases. Therefore, as the film thickness of silicon increases, it is necessary to reduce the beam width in order to increase the energy density, resulting in reduced throughput. In particular, when a panel on which both a SELAX-TFT and an ELA-TFT are mounted is fabricated, the film thickness of silicon is desirably increased to improve the characteristics of the SELAX-TFT, while the film thickness of silicon cannot be increased because the throughput of the silicon crystallization for the ELA-TFT is reduced. Furthermore, when a continuous-wave laser beam is applied to amorphous silicon or polysilicon with a film thickness on the order of 50 nm to produce pseudo single crystal, aggregation may occur in the silicon film. The aggregation in the silicon film resulting from laser application can be prevented by increasing the film thickness of the silicon layer. Such an increase, however, causes a difficulty in crystallization using excimer laser annealing (ELA).

An object of the invention is to provide a method for fabricating a thin film transistor that allows improvement in characteristics of a SELAX-TFT and improvement in crystallization throughput using excimer laser annealing (ELA), a display device using a thin film transistor fabricated by the fabrication method, and a method for fabricating the display device.

To achieve the above object, in the method for fabricating a display device according to the invention, when a thin film transistor using a pseudo single crystal semiconductor and a thin film transistor using a particulate polycrystalline semiconductor are formed on a single substrate, the film thickness of an amorphous semiconductor film before crystallization in the pseudo single crystal semiconductor portion is greater than that in the polycrystalline semiconductor portion.

In the method for fabricating a display device according to the invention, the pseudo single crystal semiconductor portion and the polycrystalline semiconductor portion are formed in the same layer, or the pseudo single crystal semiconductor portion and the polycrystalline semiconductor portion are formed in different layers.

In the method for fabricating a display device according to the invention, the layer thickness of the amorphous semiconductor film before crystallization in the pseudo single crystal semiconductor portion is 50 to 400 nm, and the layer thickness of the amorphous semiconductor film before crystallization in the polycrystalline semiconductor portion is 30 to 70 nm.

The display device according to the invention has a thin film transistor using a pseudo single crystal semiconductor and a thin film transistor using a particulate polycrystalline semiconductor on a single substrate. The average film thickness of the semiconductor layer in the thin film transistor using the pseudo single crystal semiconductor is greater than the average film thickness of the semiconductor layer in the thin film transistor using the polycrystalline semiconductor.

In the display device according to the invention, the pseudo single crystal semiconductor portion and the polycrystalline semiconductor portion are formed in the same layer, or the pseudo single crystal semiconductor portion and the polycrystalline semiconductor portion are formed in different layers.

In the display device according to the invention, the gate electrode of one of the thin film transistors is formed of a semiconductor film formed in the same layer as the semiconductor layer of the other thin film transistor.

In the display device according to the invention, the average film thickness of the pseudo single crystal semiconductor can be 50 to 400 nm, and the average film thickness of the polycrystalline semiconductor can be 30 to 70 nm.

By differentiating the film thickness of the amorphous semiconductor before crystallization in the SELAX-TFT area from that in the ELA-TFT area, it is possible to improve the characteristics of the SELAX-TFT and the throughput of the ELA crystallization. The improvement in characteristics of the SELAX-TFT allows implementation of higher-performance circuits on the substrate.

A plurality of semiconductor films, for example, silicon films, with different film thicknesses can be fabricated according to applications. For example, by fabricating a thin silicon film in the first layer to a thickness on the order of 30 to 50 nm and applying it to a thin film transistor in a pixel circuit, photoconductivity is reduced. Furthermore, by fabricating a thick silicon film in the second layer to a thickness on the order of 50 to 400 nm and applying it to a thin film transistor in a peripheral circuit including a drive circuit, low-voltage driving can be performed.

Increase in the film thickness of the silicon film increases the size of crystal grains and hence improves some of the characteristics. (For example, when the film thickness of pseudo single crystal (SELAX) silicon is 50 to 150 nm, the mobility increases by approximately 25% in nMOS and approximately 60% in pMOS.) Furthermore, aggregation can be prevented. When silicon films are formed in different layers, it is possible to set film thicknesses of the gate insulating films appropriate to the silicon film in the first layer and the silicon film in the second layer, thus achieving improvement in performance of thin film transistors.

Since the film thickness of the gate insulating film of the pseudo single crystal (SELAX) silicon TFT can be reduced, resulting reduction in variation and improvement in characteristics allow low-voltage driving. (For example, when the thickness of the gate insulating film is 100 to 85 nm, the variation in the threshold voltage Vth decreases by approximately 30%, and the current increases by approximately 25%.)

BRIEF DESCRIPTION OF THE DRAWINGS

FIGS. 4A to 4C explain how the SELAX crystal looks like;

DESCRIPTION OF THE PREFERRED EMBODIMENTS

Embodiments of the best mode for carrying out the invention will be described below in detail with reference to the drawings.

First Embodiment

Figure 1:
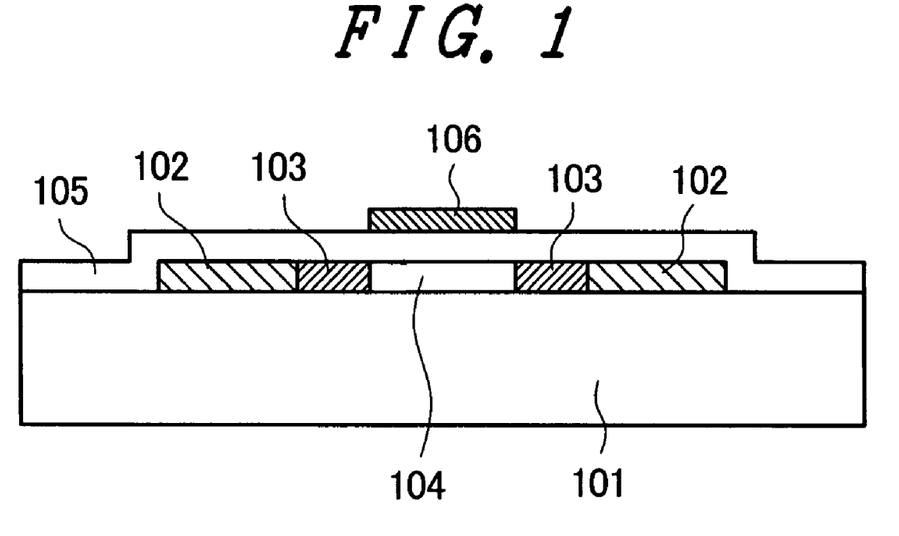
FIG. 1 is a cross-sectional view of a top-gate TFT for explaining a first embodiment of the invention.

FIG. 1 is a cross-sectional view of a top-gate TFT for explaining a first embodiment of the invention. When the top-gate TFT is an n-channel TFT, a polysilicon layer 104 on a glass substrate 101 has source/drain areas 102 as well as LDD areas 103 for electric field reduction. When the top-gate TFT is a p-channel TFT, typically, no LDD area 103 is formed. On the resultant structure, a gate insulating film layer 105 and a gate metal layer 106 are formed.

Figure 2A:
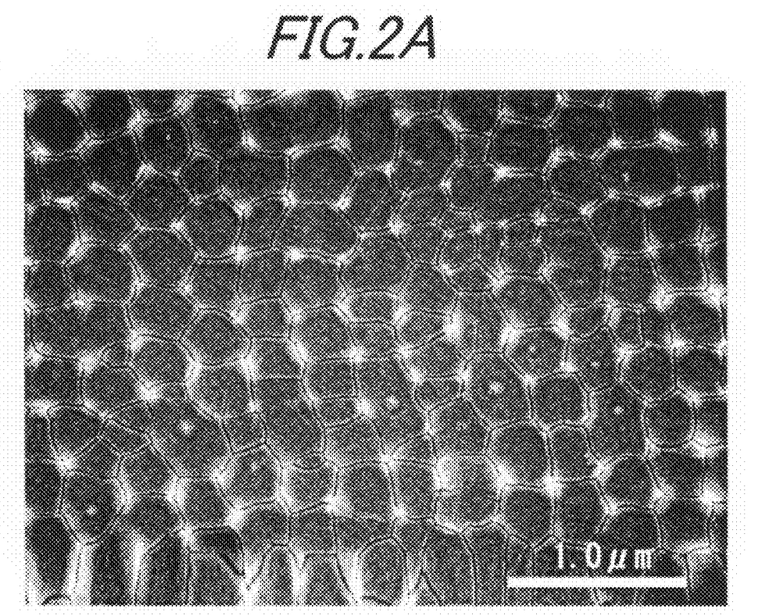
FIGS. 2A and 2B are micrographs of the main portions of ELA and SELAX crystals.
Figure 2B:
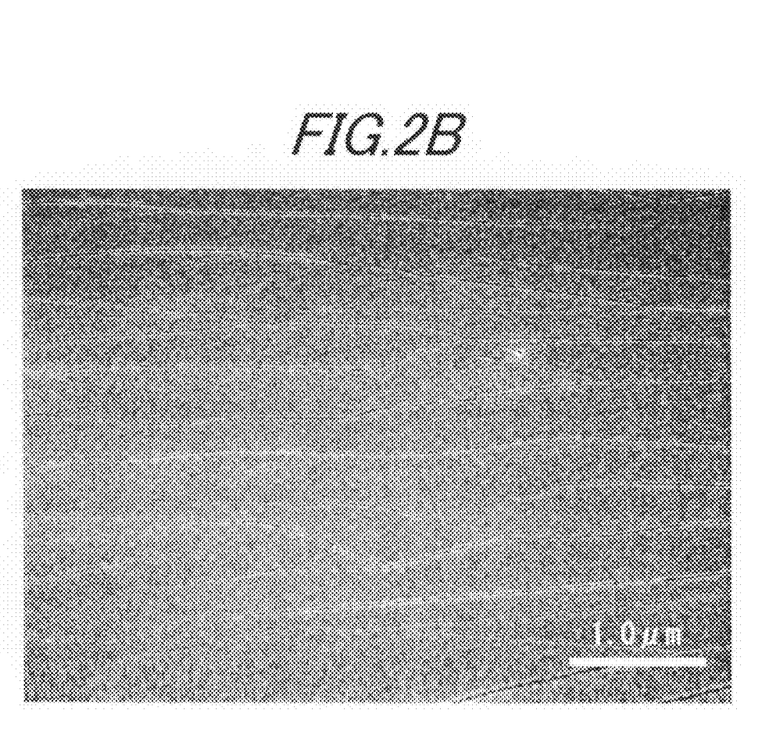

FIG. 2A shows a scanning electron micrograph of crystal grains crystallized in an ELA apparatus (hereinafter referred to as ELA crystal). ELA crystallization uses a pulse laser in its crystallization process, so that the length of the crystal growth time is reduced and hence particulate crystal grains are obtained, the diameter of which ranges from approximately 0.3 to 1 μm. On the other hand, FIG. 2B shows a scanning electron micrograph of crystal grains crystallized in a SELAX apparatus (hereinafter referred to as SELAX crystal). SELAX crystallization uses a continuous-wave laser to continuously control the direction of crystal growth, so that SELAX crystallization is characterized in that the grain boundary is oriented in one direction (lateral direction).

Figure 3A:
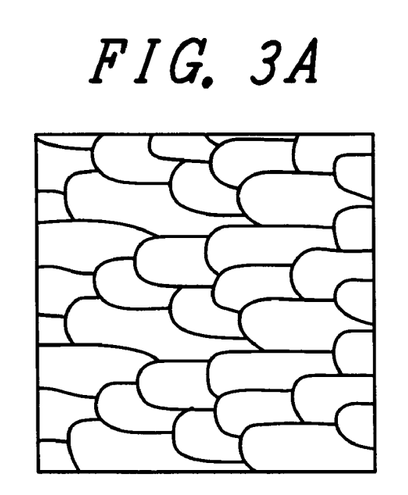
FIGS. 3A to 3C explain the shapes of crystal grains crystallized in a SELAX apparatus as well as laser energy used for crystallization.
Figure 3B:
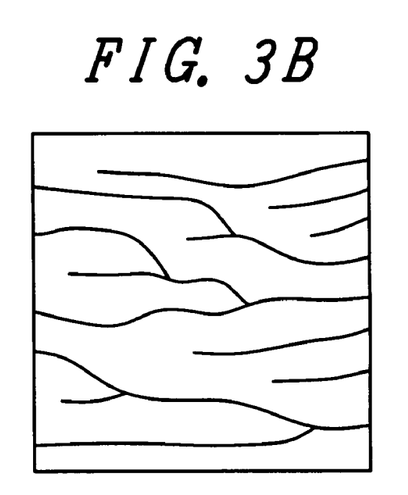
Figure 3C:
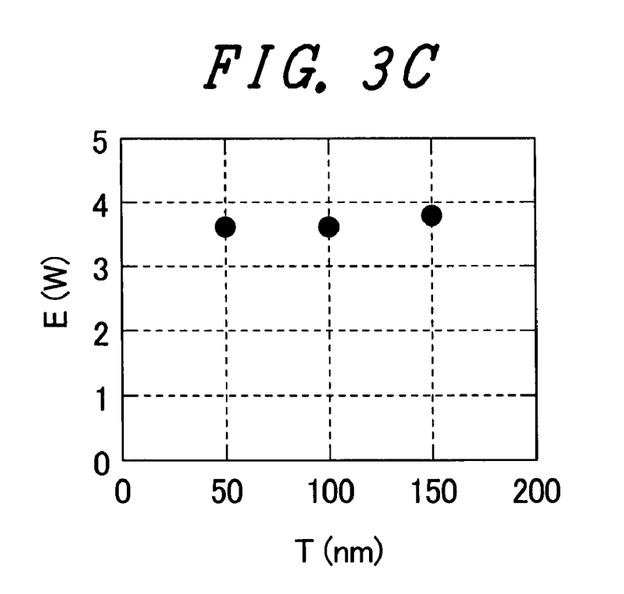

FIGS. 3A to 3C explain the shapes of the crystal grains crystallized in a SELAX apparatus as well as the laser energy used for crystallization. The shapes of crystal grains crystallized in a SELAX apparatus vary according to the magnitude of the laser energy. When the laser energy is not sufficient, the crystal growth intermittently stops as shown in FIG. 3A, resulting in crystal grains that look like fish scales. When the energy is sufficient, SELAX crystal, such as that shown in FIG. 3B, is obtained. FIG. 3C shows the relationship between the film thickness of the silicon layer and the energy necessary to obtain the SELAX crystal. The energy necessary to obtain the SELAX crystal substantially remains unchanged as the film thickness of the silicon layer increases.

Figure 4A:
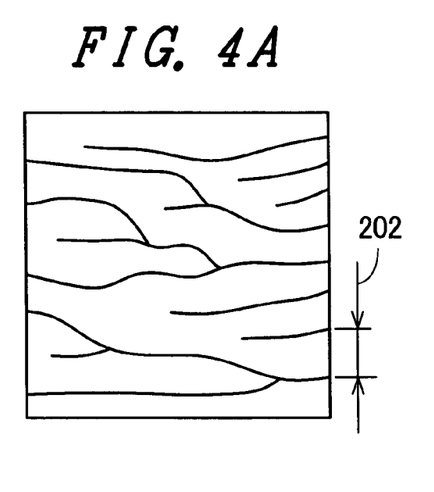
Figure 4B:
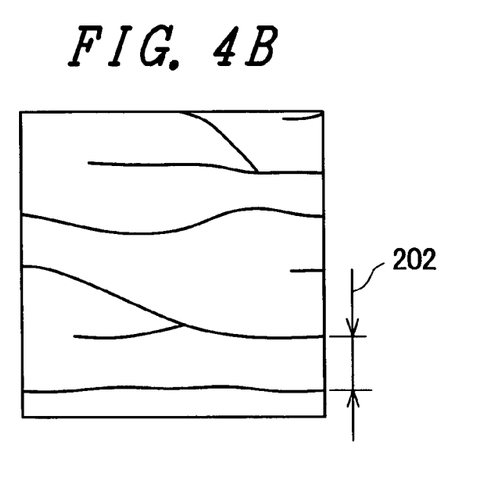
Figure 4C:
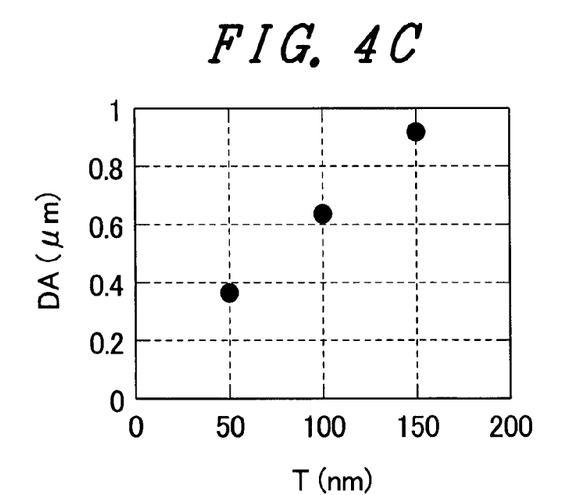

FIGS. 4A to 4C explain how the SELAX crystal looks like. The crystal grain width 202 of the SELAX crystal shown in FIG. 4A depends on the film thickness of the silicon layer. FIG. 4B shows how the SELAX crystal looks like when the film thickness of the silicon layer is thicker. As shown in FIGS. 4A and 4B, increase in film thickness of the silicon layer increases the crystal grain width. FIG. 4C shows how the crystal grain width varies when the film thickness of the silicon layer changes from 50 nm to 100 nm to 150 nm, as actual experimental results. The experimental results also show that the crystal grain width increases as the film thickness of the silicon layer increases.

Figure 5A:
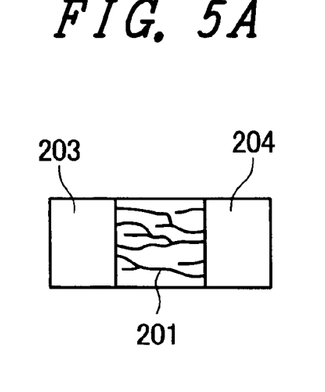
FIGS. 5A to 5D explain the carrier mobility of the SELAX crystal.
Figure 5B:
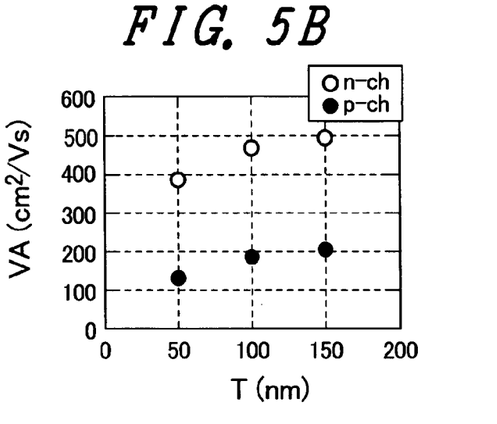

FIGS. 5A to 5D explain the carrier mobility of the SELAX crystal. The n-channel and p-channel single drains shown in FIG. 1 were used to fabricate prototype TFTs with channel width W/channel length L=4 μm/4 μm. FIG. 5B shows the TFT characteristics when the source 203 and the drain 204 are disposed parallel to the grain boundary 201 as shown in FIG. 5A. The vertical axis represents the average mobility VA ($cm^2$/VS), and the horizontal axis represents the film thickness T (nm). FIG. 5B shows that the mobility increases both in the n-channel and p-channel types as the Si film thickness increases from 50 nm to 100 nm to 150 nm.

Figure 5C:
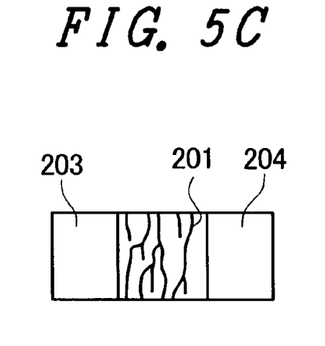
Figure 5D:
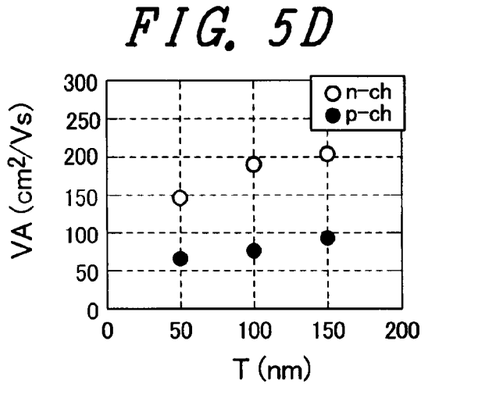

By increasing the thickness of the polysilicon film in the SELAX-TFT portion, the carrier scattering due to the grain boundary is reduced and hence the TFT characteristics are improved, allowing fabrication of a higher-performance circuit. On the other hand, FIG. 5D shows the TFT characteristics when the source 203 and the drain 204 are disposed perpendicular to the grain boundary 201 as shown in FIG. 5C. In this case, again, the TFT characteristics are improved as the film thickness increases.

Figure 6:
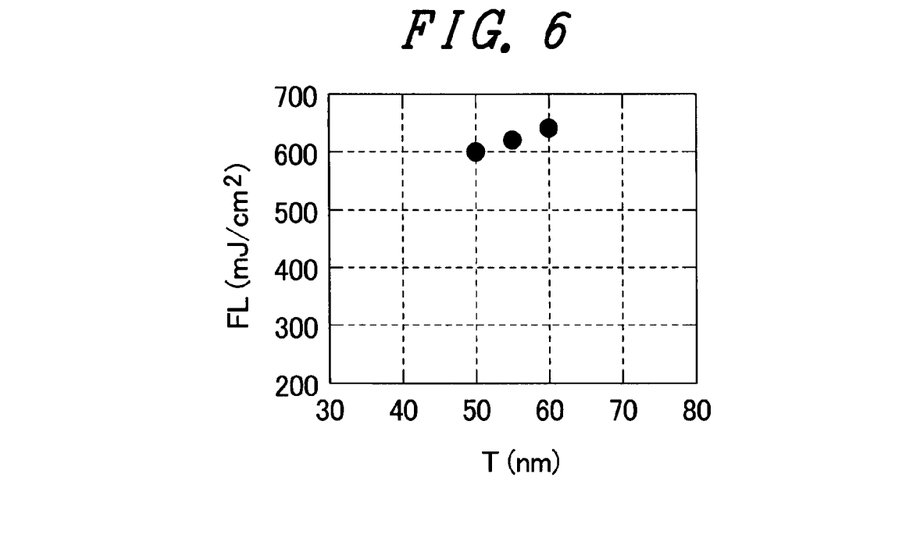
FIG. 6 explains the relationship between the film thickness of a polysilicon layer and the energy necessary to obtain a polysilicon layer having a grain diameter of 0.3 to 1 μm in ELA crystallization.

FIG. 6 explains the relationship between the film thickness of the polysilicon layer and the energy necessary to obtain a polysilicon layer having a grain diameter of 0.3 to 1 μm in ELA crystallization. The vertical axis represents energy fluence FL ($mJ/cm^2$), and the horizontal axis represents the film thickness T (nm). As the film thickness of the polysilicon layer increases, the necessary energy also increases. There is thus a concern about reduced throughput, unlike SELAX crystallization.

Figure 7A:
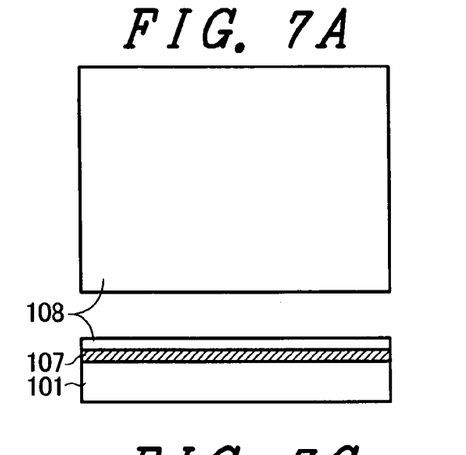
FIGS. 7A to 7F explain how to fabricate thin film transistors in which the film thickness of the polysilicon layer in a SELAX-TFT area differs from that in an ELA-TFT area.

FIGS. 7A to 7F explain how to fabricate thin film transistors in which the film thickness of the polysilicon layer in the SELAX-TFT area differs from that in the ELA-TFT area. The upper part of each figure shows a plan view and the lower part shows a cross-sectional view. First, a silicon nitride (SiN) film 107 and a silicon oxide (SiO) film 108 are formed on a glass substrate 101 in order to prevent impurities from the glass, such as Na, from climbing up (FIG. 7A).

Figure 7B:
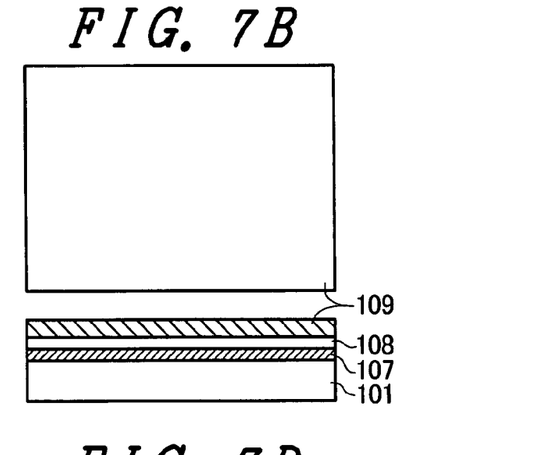

An amorphous silicon layer 109 having a film thickness corresponding to the difference between the film thickness necessary in the SELAX-TFT area and the film thickness necessary in the ELA-TFT area is deposited over the substrate in a CVD apparatus (FIG. 7B).

Figure 7C:
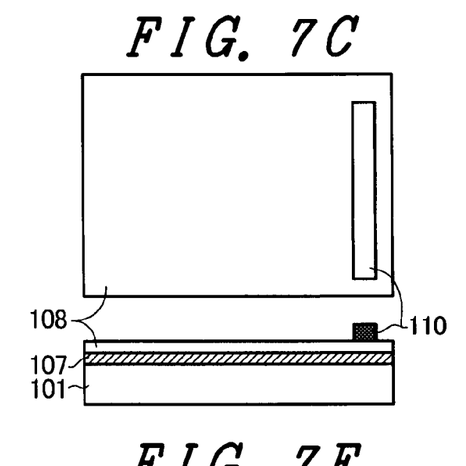

To leave the amorphous silicon only in the SELAX-TFT area, upon resist application, the resist is left only in the SELAX-TFT area and the amorphous silicon is etched away from the ELA-TFT portion. An amorphous silicon layer 110 is thus left only in the SELAX-TFT area (FIG. 7C).

Figure 7D:
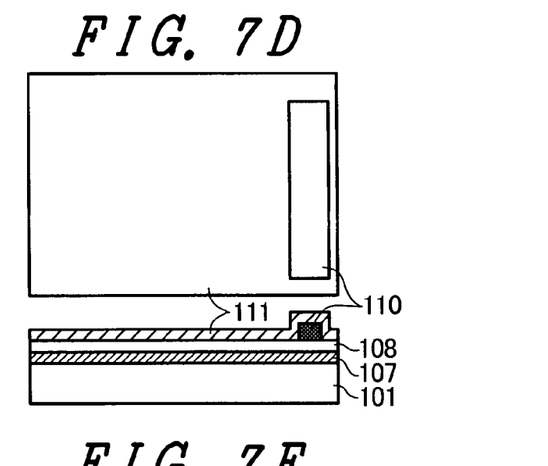

An amorphous silicon layer 111 having a film thickness necessary in the ELA-TFT area is deposited over the substrate in a CVD apparatus (FIG. 7D).

Figure 7E:
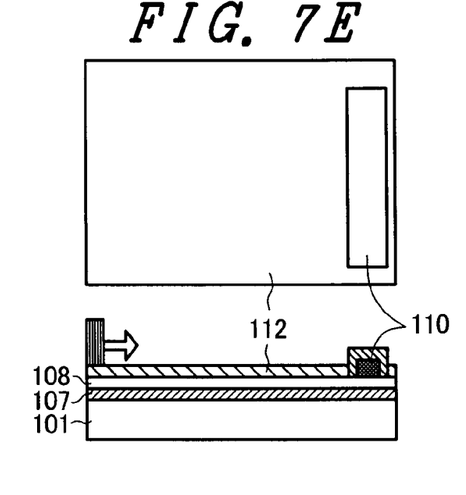
Figure 7F:
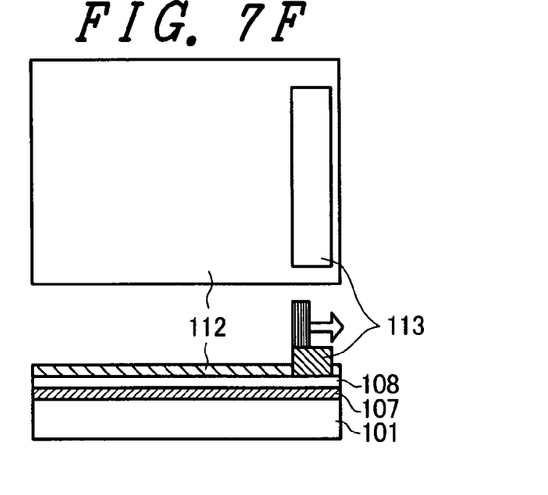

An ELA apparatus is used to crystallize the entire substrate to form an ELA polysilicon layer 112 (FIG. 7E). In this process, the fluence of the excimer laser is set at the magnitude at which the silicon layer in the ELA-TFT portion is crystallized. Therefore, the silicon layer in the SELAX-TFT portion where the film thickness thereof is greater than that of the silicon layer in the ELA-TFT portion becomes fine crystals. Then, the SELAX-TFT portion is crystallized in a SELAX apparatus to form a SELAX polysilicon layer 113 (FIG. 7F).

Figure 8A:
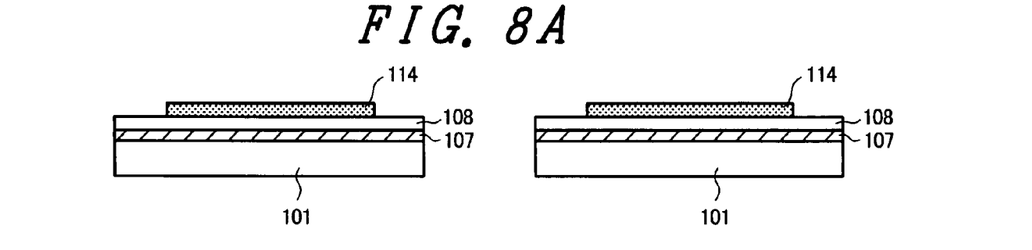
FIGS. 8A to 8H are cross-sectional views for explaining a process flow for fabricating top-gate n-channel and p-channel TFTs using the silicon layer that has undergone crystallization.
Figure 8B:
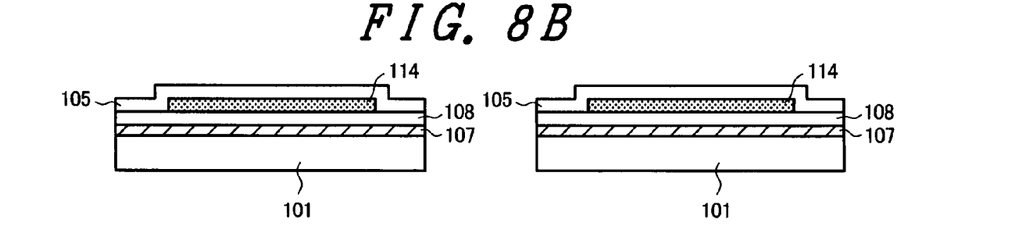

FIGS. 8A to 8H are cross-sectional views for explaining a process flow for fabricating top-gate n-channel (N-MOS) and p-channel (P-MOS) TFTs using the silicon layer that has undergone crystallization. In FIGS. 8A to 8H, the left row shows the N-MOS TFT, and the right row shows the P-MOS TFT. First, photo-etching is used to process the polysilicon layer 113 shown in FIG. 7F into an island-shaped polysilicon layer 114 (FIG. 8A). The gate insulating film 105 is deposited on the polysilicon layer 114 (FIG. 8B).

Figure 8C:
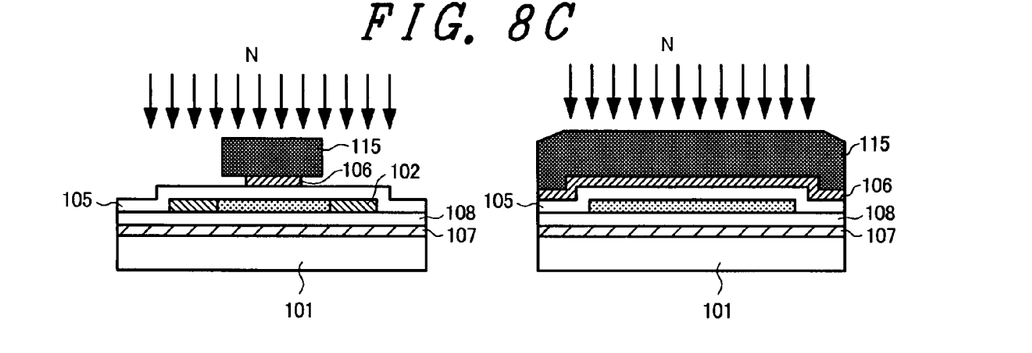

After the gate electrode 106 is deposited, only for the N-MOS, resist 115 is left and the gate electrode 106 is side-etched by approximately 1 μm on both sides as a self-aligned LDD layer formation process. In this state, a high-concentration n-type impurity N is implanted to form the source/drain layers 102 in the polysilicon layer. On the other hand, for the P-MOS, since the resist 115 has been applied, no ion will be implanted into the polysilicon layer (FIG. 8C).

Figure 8D:
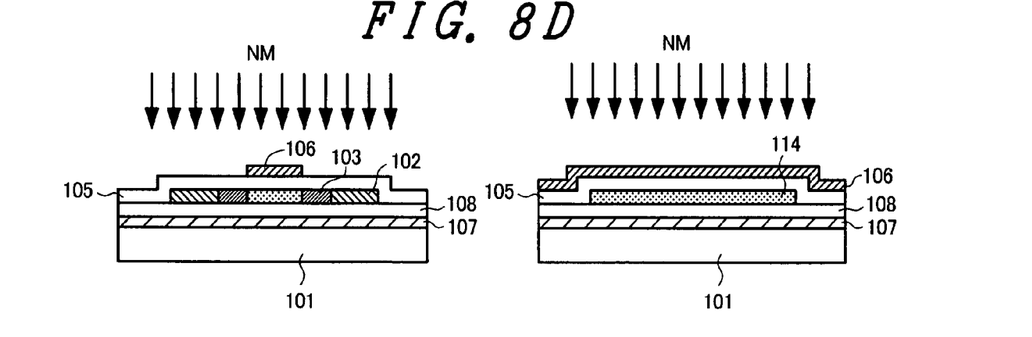

After the resist is removed, a low-concentration n-type impurity NM is implanted except the portion covered with the side-etched gate electrode 106 to form LDD (Lightly Doped Drain) areas 103 having a concentration lower than that in the source/drain layers 102. On the other hand, since the P-MOS portion is covered with the gate electrode 106, no ion will be implanted into the polysilicon layer (FIG. 8D).

Figure 8E:
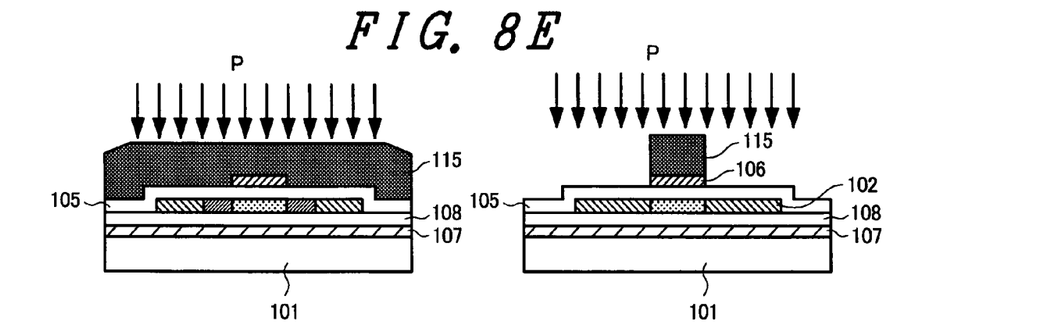
Figure 8F:
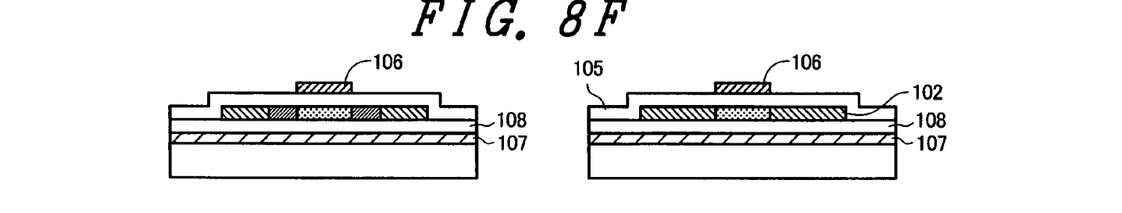
Figure 8G:
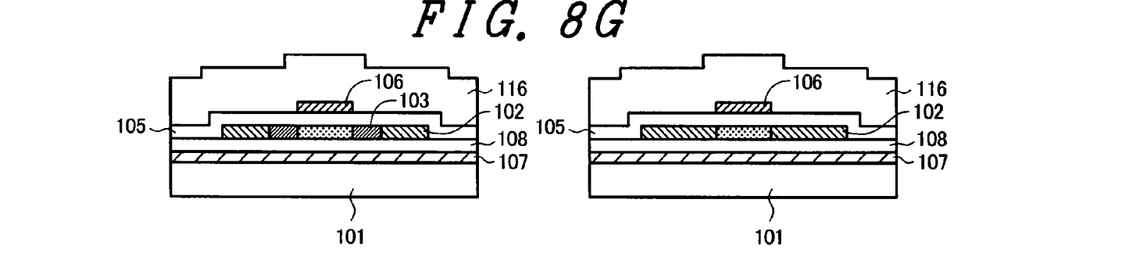

Then, to form the P-MOS, after the resist 115 is applied, the gate electrode 106 is etched only in the P-MOS portion. In this state, a high-concentration p-type impurity P is implanted to form the source/drain areas 102 in the polysilicon layer. On the other hand, since the resist 115 has been applied to the N-MOS portion, no ion will be implanted into the polysilicon layer (FIG. 8E).

Figure 8H:
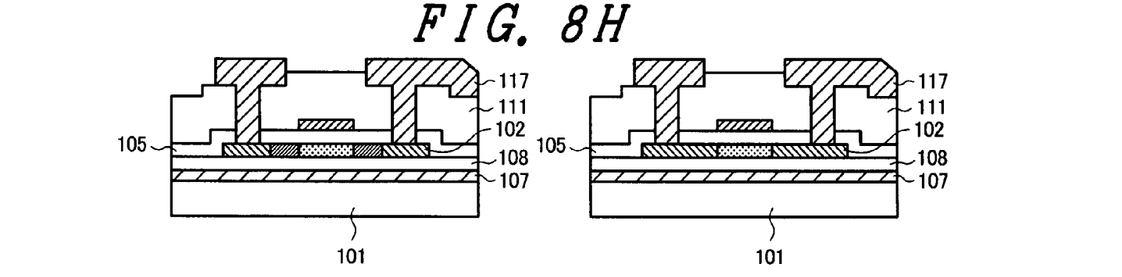

After the resist 115 is removed (FIG. 8F) and an interlayer insulating film 116 is deposited (FIG. 8G), photo-etching is used to process contact holes to the source/drain areas and form source/drain electrodes 117 (FIG. 8H).

Figure 9:
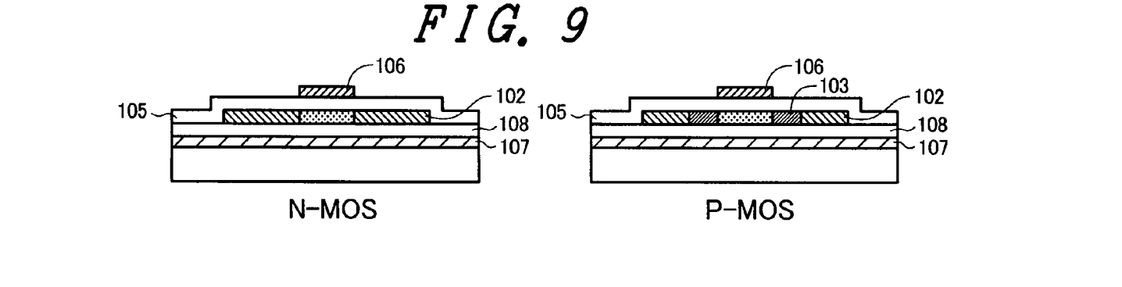
FIG. 9 show cross-sectional views of a standalone N-MOS single drain TFT and a standalone P-MOS LDD TFT.

The method described above is used to from TFTs in the pixel section and the circuit section. The circuit configuration of the transistor is any one of the standalone N-MOS LDD TFT and the standalone P-MOS single drain TFT shown in FIGS. 8A to 8H, the standalone N-MOS single drain TFT and the standalone P-MOS LDD thin film transistor shown in FIG. 9 illustrating completed TFTs, and a C-MOS TFT obtained by combining the above N-MOS and P-MOS TFTs. In this way, TFTs formed of polysilicon films with film thicknesses different from each other due to the shapes of crystal grains are fabricated on the same substrate.

Figure 10:
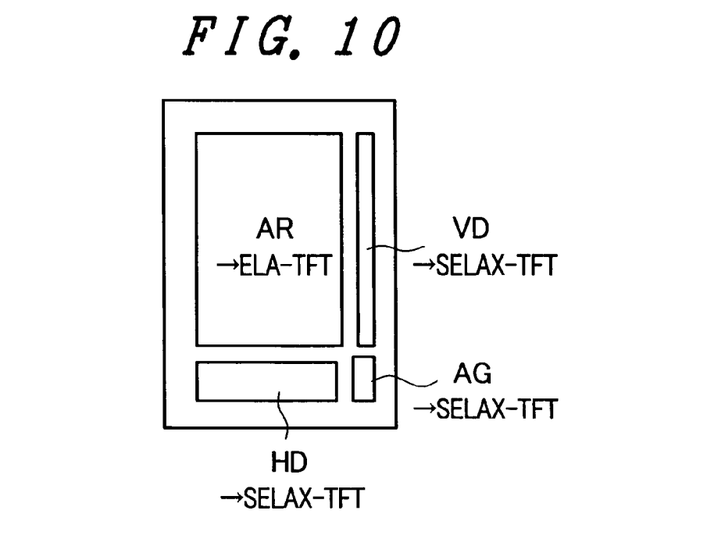
FIG. 10 is a plan view of a substrate for explaining circuit layout in a display panel.

FIG. 10 is a plan view of the substrate for explaining circuit layout in the display panel. As shown in FIG. 10, AR denotes a display area (pixel area), VD denotes a vertical drive circuit (a data line drive circuit and a drain driver), HD denotes a horizontal drive circuit (a scan line drive circuit and a gate driver), and AG denotes a high-performance circuit (other peripheral circuits). The ELA-TFT or the SELAX-TFT is selected and used according to the TFT characteristics necessary in each of the areas in the circuit layout shown in FIG. 10. The shapes of crystal grains in the polysilicon layers in the ELA-TFT and the SELAX-TFT are those shown in FIGS. 2A and 2B, respectively.

Figure 11A:
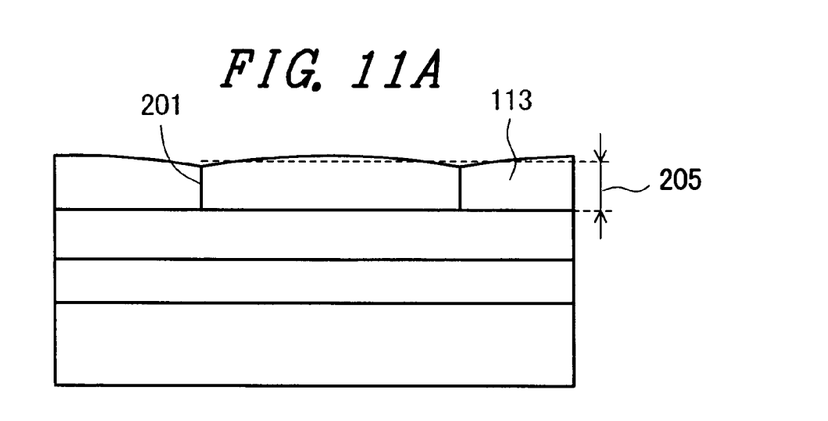
FIGS. 11A and 11B are cross-sectional views of substrates for explaining the cross-sectional shapes of the SELAX-TFT and ELA-TFT polysilicon layers.
Figure 11B:
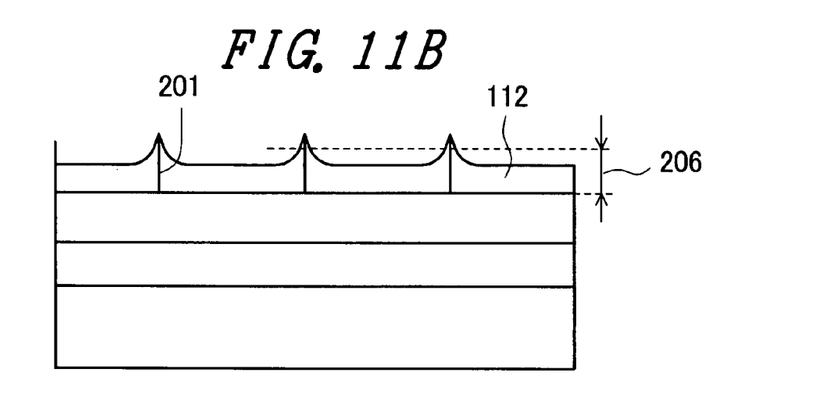

FIGS. 11A and 11B are cross-sectional views of the regions ranging from the substrate to the silicon layer in the SELAX-TFT and ELA-TFT. FIG. 11A shows a cross section of the SELAX-TFT silicon layer 113, and FIG. 11B shows a cross section of the ELA-TFT silicon layer 112. In the cross section of the SELAX-TFT silicon layer 113, protrusions and irregularities are small and the portion where the grain boundary 201 is present has the thinnest film thickness, as shown in FIG. 11A. On the other hand, in the ELA-TFT silicon layer 112, protrusions and irregularities are large, as shown in FIG. 11B. The film thicknesses of the SELAX-TFT silicon layer and the ELA-TFT silicon layer are thus not uniform. The average film thicknesses of the SELAX-TFT silicon layer and the ELA-TFT silicon layer are therefore herein defined as the film thicknesses of the silicon layers. The average film thickness is calculated by dividing the volume of the silicon layer including the irregularities by the area the silicon layer.

The average film thickness 205 of the SELAX-TFT silicon layer is desirably 50 to 400 nm, while the average film thickness 206 of the ELA-TFT silicon layer is desirably 30 to 70 nm. The average film thickness 205 of the SELAX-TFT polysilicon layer thus is characterized by being greater than the average film thickness 206 of the ELA-TFT silicon layer. This characteristic provides an effect of preventing aggregation in pseudo single crystallization.

The film thickness of the amorphous silicon (a-Si) before crystallization is substantially equal to the average film thicknesses of the crystallized polysilicon and pseudo single crystalline silicon. Therefore, in the SELAX-TFT area, the average film thickness of the amorphous silicon before crystallization is desirably 50 to 400 nm. In the ELA-TFT area, the film thickness of the amorphous silicon before crystallization is desirably 30 to 70 nm. The film thickness of the amorphous silicon in the SELAX-TFT area is greater than that in the ELA-TFT area.

Second Embodiment

Figure 12A:
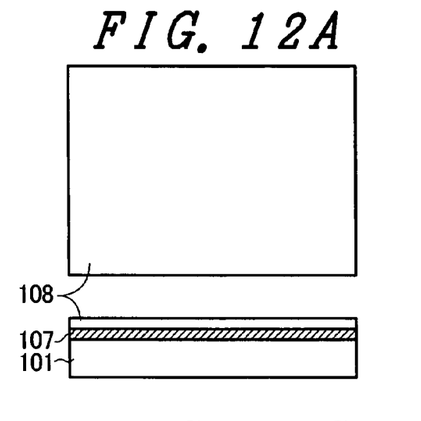
FIGS. 12A to 12F explain a fabrication process flow that is similar to that shown in FIG. 7 and describes a second embodiment of the invention.
Figure 12B:
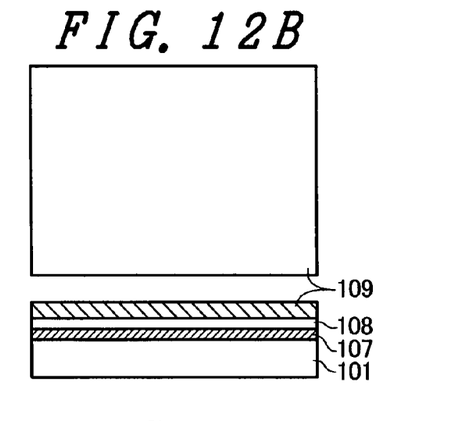

FIGS. 12A to 12F explain a fabrication process flow that is similar to that shown in FIG. 7 and describes a second embodiment of the invention. In FIG. 12, channel implantation may be additionally performed to the SELAX-TFT portion. To control threshold voltages Vth for the ELA-TFT and the SELAX-TFT, the channel implantation concentration may be changed. After an amorphous silicon layer 109 is deposited over the substrate in a CVD apparatus, as in FIGS. 7A and 7B, an impurity, such as boron or phosphorus, is implanted into the amorphous silicon layer 109 (FIGS. 12A and 12B). This impurity allows adjustment of the threshold voltages Vth for the ELA-TFT and the SELAX-TFT.

Since increase in film thickness of the silicon layer enhances the carrier mobility in the thin film transistor, the TFT can be configured in such a way that the source and drain are disposed perpendicular to the crystal growth direction (vertical SELAX-TFT). The SELAX-TFT typically has satisfactory operational characteristics only when the source and drain are disposed parallel to the crystal growth direction. Obedience to this design constraint in a circuit layout process causes a large circuit area, so that it is convenient if the TFT can be configured as described above (vertical SELAX-TFT). By increasing the film thickness of the polysilicon layer in the vertical SELAX-TFT, the degree of circuit layout freedom can be increased.

Since only a small area is crystallized at a time in the SELAX process, it is efficient to crystallize only a necessary area. Therefore, a predetermined area is crystallized in the following way.

A method for simultaneously forming alignment marks will be described with reference to an example in which six panels are produced from one substrate. In FIG. 12, a silicon nitride film 107 and a silicon oxide film 108 are formed on a glass substrate 101 in order to prevent impurities from the glass, such as Na, from climbing up. An amorphous silicon layer 109 having a film thickness corresponding to the difference between the film thickness necessary in the SELAX-TFT area and the film thickness necessary in the ELA-TFT area is deposited over the substrate in a CVD apparatus.

Figure 12C:
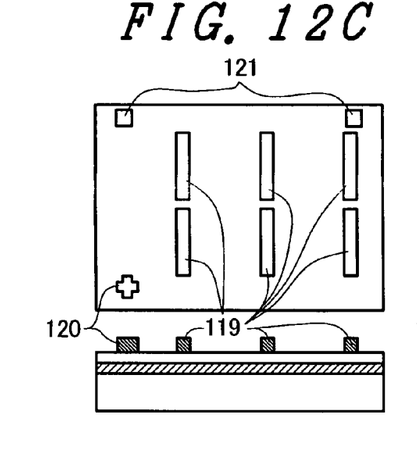

To leave SELAX-TFT areas 119, a target mark 120 for laser irradiation, and photomask alignment marks 121 for processing the polysilicon layer into an island-shaped polysilicon layer, upon resist application, resist is left only in the above areas to remove all the amorphous silicon in the ELA-TFT portion (FIG. 12C).

Figure 12D:
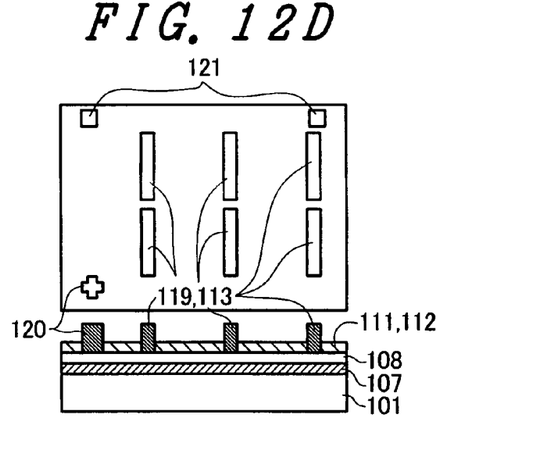

An amorphous silicon layer 111 having a film thickness necessary in the ELA-TFT area is deposited over the substrate in a CVD apparatus, as shown in FIG. 12D. In this process, the SELAX-TFT areas 119, the target mark 120, and the alignment marks 121 become thicker. An ELA apparatus is used to crystallize the entire substrate to form an ELA polysilicon layer 112. Then, the SELAX-TFT portions are crystallized in a SELAX apparatus to form SELAX polysilicon layers 113. In this process, predetermined areas (SELAX-TFTs) are crystallized into SELAX portions using the target mark 120 with as a reference.

Figure 12E:
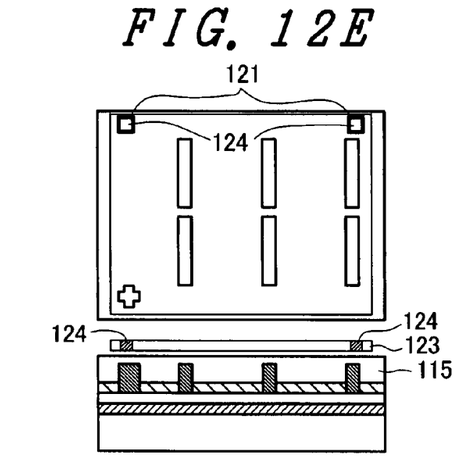
Figure 12F:
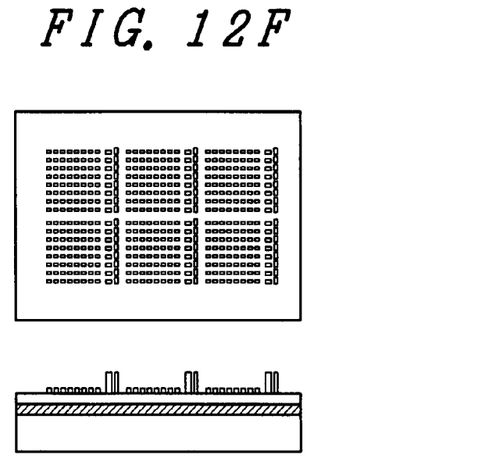

Resist 115 is applied, and alignment marks 124 formed on a photomask 123 are aligned with the alignment marks 121 on the glass substrate 101. Then, photo-etching is used to process the polysilicon layer into an island-shaped polysilicon layer (FIGS. 12E and 12F). Taper-etching is used to etch the polysilicon layer. In the invention, the film thickness of the SELAX-TFT polysilicon layer becomes greater than that of the gate insulating film layer. Thus, if typical etching is used, the withstand voltage at the coverage portion decreases. To prevent this problem, when etching is performed, taper-etching is used to improve the withstand voltage at the coverage portion.

Third Embodiment

Figure 13:
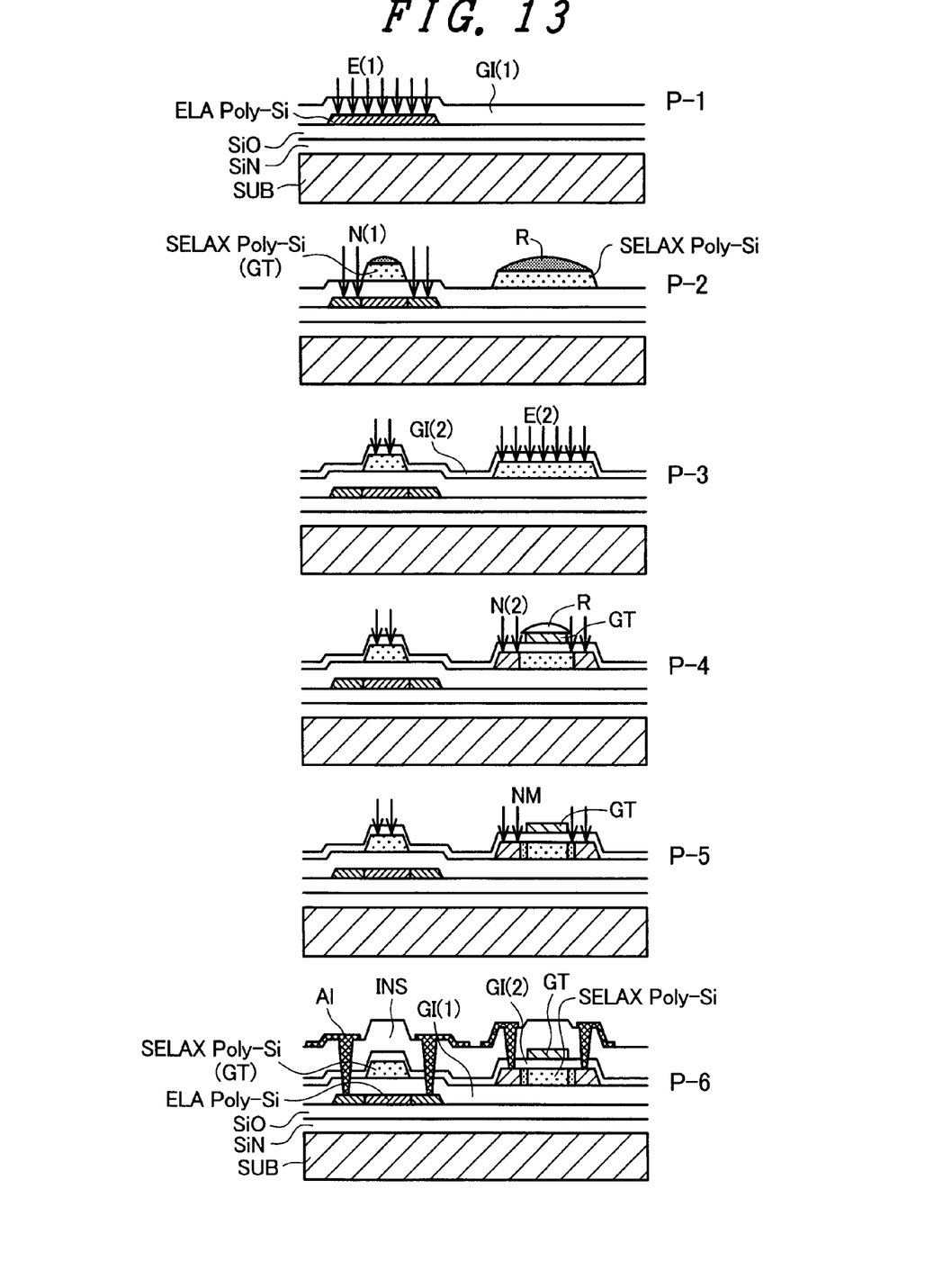
FIG. 13 is process flow diagrams for explaining a third embodiment of the invention.

FIG. 13 is process flow diagrams for explaining a third embodiment of the invention. The third embodiment is implemented in the order from Process 1 (hereinafter labeled as P-1) to P-6 shown in FIG. 13. First, SiN and SiO are deposited in this order as underlying films on a glass substrate SUB. Amorphous silicon is deposited on these underlying films to a film thickness on the order of 30 to 70 nm, preferably 45 to 55 nm. Then, ELA crystallization is used to form ELA polysilicon (ELA poly-Si) followed by patterning. A gate insulating film GI(1) is then deposited to cover the ELA polysilicon (ELA poly-Si) and ion implantation E1 for threshold voltage adjustment is performed (P-1).

Amorphous silicon is deposited to a film thickness on the order of 50 to 400 nm, preferably 100 to 300 nm, and a continuous-wave laser beam is applied thereto to form pseudo single crystal silicon (SELAX poly-Si). A photolithography process including resist application, patterned exposure, and development is used to pattern the pseudo single crystal silicon so as to leave a pattern for a channel layer and a pattern for an ELA-TFT gate electrode GT. Furthermore, the pseudo single crystal silicon layer (SELAX poly-Si) is used as a mask to perform high-concentration n-type impurity N ion implantation N1 to the ELA polysilicon (ELA poly-Si). Character R denotes resist (P-2).

A gate insulating film GI(2) is deposited on the resultant structure and ion implantation E2 is performed (P-3).

Then, refractory metal, such as Mo, or an alloy thereof is deposited on the resultant structure to a thickness on the order of 100 to 200 nm, and a photolithography process including resist application, patterned exposure, and development is used to form a SELAX-TFT gate electrode GT. The gate electrode GT is over-etched from the edges of the resist R to recessed positions. In this process, the resist R is used as a mask to perform high-concentration n-type impurity ion implantation N2 to the SELAX poly-Si. The ELA-TFT gate electrode also becomes conductive in this process (P-4).

The resist R is removed and low-concentration n-type impurity ion implantation is performed to form LDDs (P-5).

Then, an interlayer insulating film INS is deposited, and contact holes are formed in such way that they reach respective poly-Si layers. Aluminum (Al) is deposited to form source and drain wiring (P-6).

In this way, the thickness of the pseudo single crystal silicon can be increased to prevent aggregation, while the ELA crystal remains unchanged. Since the pseudo single crystal silicon has low protrusions, the withstand voltage of the gate insulating film in the pseudo single crystal silicon is higher than that in the ELA polysilicon. The thickness of the gate insulating film GI(2) can therefore be reduced, and this reduction in film thickness improves the characteristics thereof, allowing low-voltage driving. For example, the gate insulating film of the ELA-TFT is set to 85 to 12 nm in thickness, while the gate insulating film of the pseudo single crystal silicon TFT is set to 50 to 85 nm. However, when the ends of the pseudo single crystal silicon are perpendicularly shaped, the coverage is not satisfactory, so that steps cause disconnection in the insulating film. To address this problem, the ends are tapered with a taper angle of 70 degrees or smaller. The ELA polysilicon is used for TFTs in the pixel circuit, while the pseudo single crystal silicon is used in the peripheral circuits.

Fourth Embodiment

Figure 14:
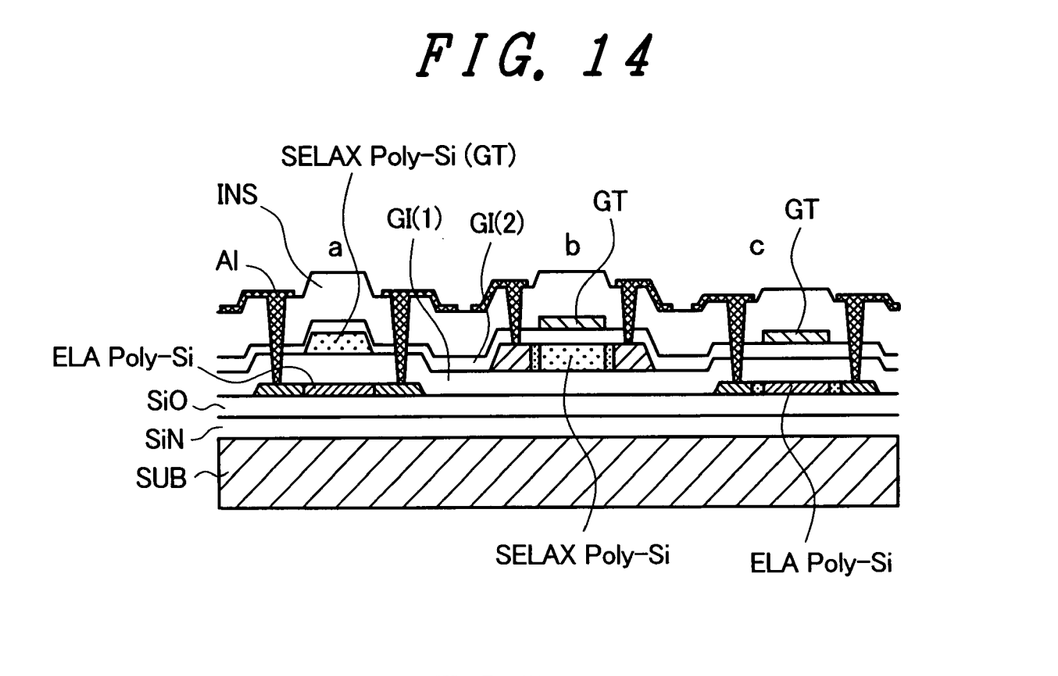
FIG. 14 is a cross-sectional view for explaining a fourth embodiment of the invention.

FIG. 14 is a cross-sectional view for explaining a fourth embodiment of the invention. FIG. 14 shows two ELA polysilicon thin film transistors (a and c) and one SELAX polysilicon thin film transistor (b), three thin film transistors in total. In the fourth embodiment, high-concentration n-type impurity N implantation to one of the ELA polysilicon thin film transistors (c) is performed after the second gate insulating film GT(2) shown in FIG. 13 is formed.

Fifth Embodiment

Figure 15:
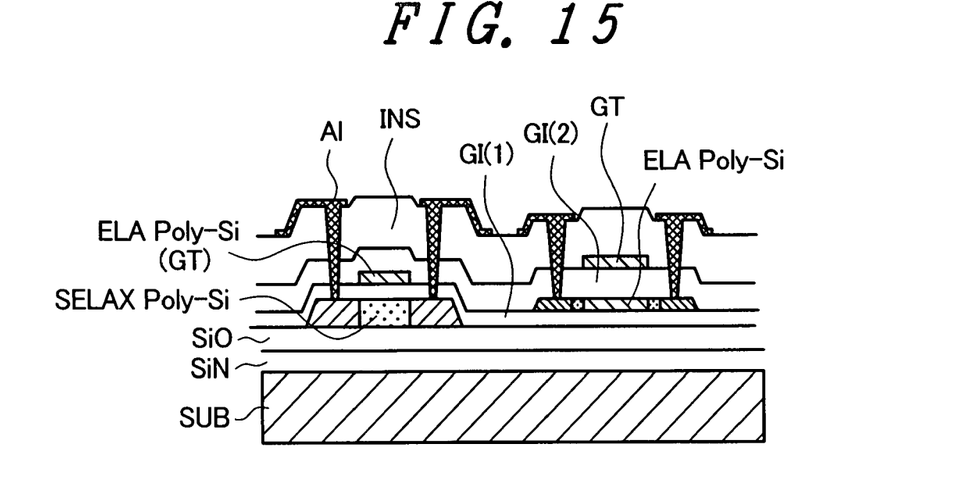
FIG. 15 is a cross-sectional view for explaining a fifth embodiment of the invention.

FIG. 15 is a cross-sectional view for explaining a fifth embodiment of the invention. The fifth embodiment is implemented according to the process flow explained in FIG. 13 except that the ELA polysilicon layer and the pseudo single crystal silicon layer are exchanged.

Sixth Embodiment

Figure 16:
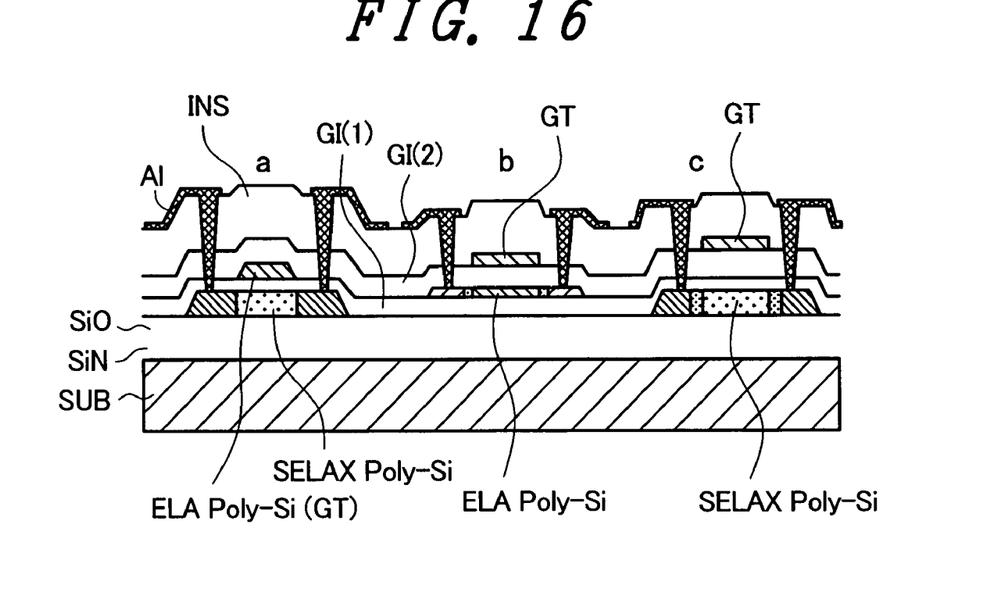
FIG. 16 is a cross-sectional view for explaining a sixth embodiment of the invention.

FIG. 16 is a cross-sectional view for explaining a sixth embodiment of the invention. In the sixth embodiment, the gate electrode is formed using Mo or the like over the pseudo single crystal silicon via gate insulating films 1 and 2. The withstand voltage of the gate insulating film is improved (c).

Seventh Embodiment

Figure 17:
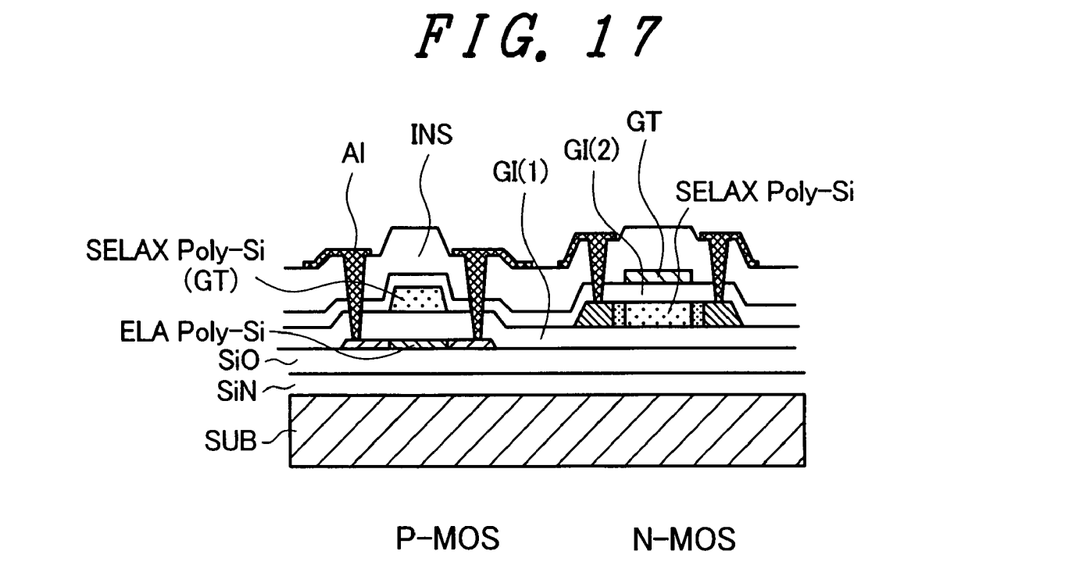
FIG. 17 is a cross-sectional view for explaining a seventh embodiment of the invention.

FIG. 17 is a cross-sectional view for explaining a seventh embodiment of the invention. When a C-MOS process is implemented, a photomask is presently required to separately perform channel implantation in the N-MOS and P-MOS. In the present embodiment, however, since the N-MOS and P-MOS are fabricated in separate layers, channel implantation can be separately performed without a mask (reduction in the number of masks).

Eighth Embodiment

Figure 18:
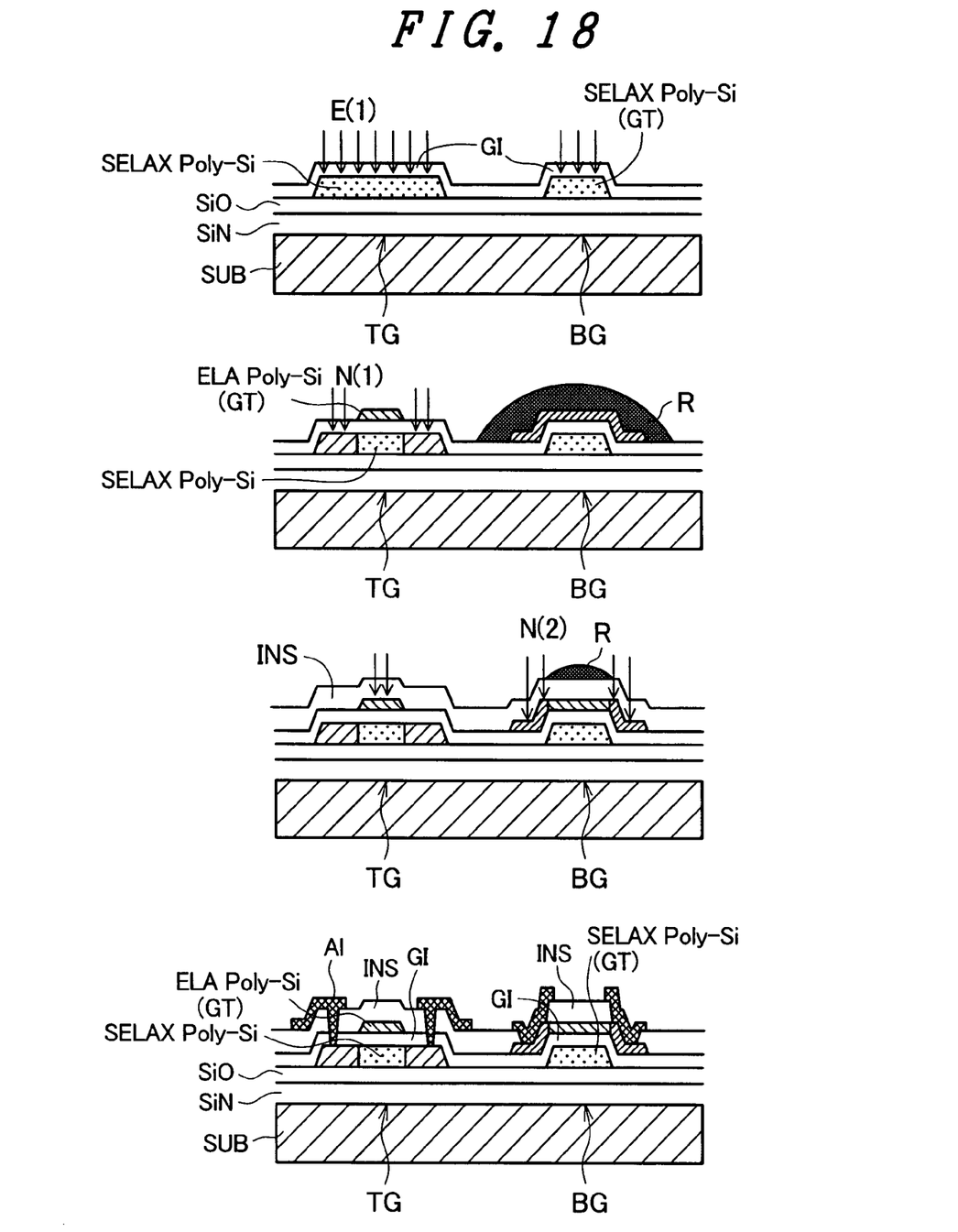
FIG. 18 show cross-sectional views for explaining an eighth embodiment of the invention.

FIG. 18 is process flow diagrams for explaining an eighth embodiment of the invention. In the eighth embodiment, the pseudo single crystal silicon is patterned in such a way that the pseudo single crystal silicon on one side becomes the channel layer of a top-gate TFT and the pseudo single crystal silicon on the other side becomes the gate electrode GT of a bottom-gate TFT, and via a gate insulating film GI, ELA polysilicon is used to form the gate electrode GT of the top-gate TFT (TG) and the channel layer of the bottom-gate TFT (BG). The top-gate TFT (TG) and the bottom-gate TFT (BG) can thus be fabricated on the same substrate SUB. In this way, two different-performance TFTs similar to those in the third and fourth embodiments can be fabricated, and the deposition of the gate electrode metal can be omitted.

The invention can also be implemented by combining the above embodiments, and the combinations can be changed, as appropriate. The semiconductor is not limited to silicon. The thin film transistor according to the invention is applicable to active-type display devices, such as liquid crystal display devices and organic EL display devices.

What is claimed is:

1. A display device having a thin film transistor using a pseudo single crystal semiconductor and a thin film transistor using a particulate polycrystalline semiconductor on a single substrate, wherein an average film thickness of a semiconductor layer in the thin film transistor using the pseudo single crystal semiconductor is greater than an average film thickness of a semiconductor layer in the thin film transistor using the polycrystalline semiconductor.

2. The display device according to claim 1, wherein the pseudo single crystal semiconductor portion and the polycrystalline semiconductor portion are formed in the same layer.

3. The display device according to claim 1, wherein the pseudo single crystal semiconductor portion and the polycrystalline semiconductor portion are formed in different layers.

4. The display device according to claim 3, wherein the gate electrode of one of the thin film transistor using the pseudo single crystal semiconductor and the thin film transistor using the particulate polycrystalline semiconductor is formed of a semiconductor film formed in the same layer as the semiconductor layer of the other thin film transistor.

5. The display device according to claim 1, wherein the average film thickness of the pseudo single crystal semiconductor is 50 to 400 nm, and the average film thickness of the polycrystalline semiconductor is 30 to 70 nm.

* * * * *